(12) United States Patent
Warren et al.

(10) Patent No.: US 10,469,715 B2
(45) Date of Patent: Nov. 5, 2019

(54) METHOD AND SYSTEM FOR HEAT SINKING OF CAMERA MODULE

(71) Applicant: FLEXTRONICS AP, LLC, San Jose, CA (US)

(72) Inventors: Gary Warren, Aurora (CA); Darren Van Roon, Bowmanville (CA); Reginald C. Grills, Oshawa (CA); Simon Chamuczynski, Oshawa (CA)

(73) Assignee: FLEXTRONICS AP, LLC, San Jose, CA (US)

( * ) Notice: Subject to any disclaimer, the term of this patent is extended or adjusted under 35 U.S.C. 154(b) by 121 days.

(21) Appl. No.: 14/986,393

(22) Filed: Dec. 31, 2015

(65) Prior Publication Data

US 2017/0195531 A1 Jul. 6, 2017

(51) Int. Cl.
| | | |
|---|---|---|
| *H04N 5/225* | (2006.01) | |
| *H05K 1/02* | (2006.01) | |
| *H05K 7/20* | (2006.01) | |
| *G03B 17/55* | (2006.01) | |
| *B23P 15/26* | (2006.01) | |

(52) U.S. Cl.
CPC .......... *H04N 5/22521* (2018.08); *B23P 15/26* (2013.01); *G03B 17/55* (2013.01); *H04N 5/2252* (2013.01); *H04N 5/2257* (2013.01); *H05K 1/021* (2013.01); *H05K 1/0201* (2013.01); *H05K 7/20509* (2013.01); *B23P 2700/10* (2013.01)

(58) Field of Classification Search
CPC .... H05K 1/0201; H05K 1/0209; H05K 1/021; H05K 7/205; H05K 7/20509; B23P 15/26; B23P 2700/10; H04N 5/2253; H04N 5/2251; H04N 5/2252; H04N 5/22521
See application file for complete search history.

(56) References Cited

U.S. PATENT DOCUMENTS

| | | | | |
|---|---|---|---|---|
| 5,729,016 A | * | 3/1998 | Klapper | ............... B60R 1/00 250/332 |
| 6,025,991 A | * | 2/2000 | Saito | ............ H05K 7/20436 165/185 |
| 6,078,359 A | * | 6/2000 | Conder | ............ H04N 5/2251 257/718 |
| 6,515,285 B1 | * | 2/2003 | Marshall | ............... G01J 5/20 250/339.03 |
| 6,892,030 B2 | * | 5/2005 | Rife | .............. G02B 7/028 250/352 |
| 7,329,869 B2 | * | 2/2008 | Cassel | ............ H04N 5/2252 250/339.03 |

(Continued)

*Primary Examiner* — Twyler L Haskins
*Assistant Examiner* — Akshay Trehan
(74) *Attorney, Agent, or Firm* — Volpe and Koenig, P.C.

(57) ABSTRACT

A method and apparatus for heat sinking a camera module, which may be used in an automotive camera, which includes but is not limited to automotive rear-view cameras, is described herein. Heating conductors and heat conductive pads may be arranged in a parallel orientation within the housing of the camera module to dissipate heat produced by the printed circuit boards (PCBs) and other components within. The heat conducting pads may conduct heat away from the PCB or component being cooled and into the heat sink, which may be a heat conducting material including but not limited to aluminum, aluminum alloys, or copper. The heating pads may also fill the air gaps within the housing of the camera module.

14 Claims, 2 Drawing Sheets

(56) References Cited

U.S. PATENT DOCUMENTS

| | | | | |
|---|---|---|---|---|
| 8,494,359 B2* | 7/2013 | Ogasawara | F16M 11/041 | 248/187.1 |
| 8,753,008 B2* | 6/2014 | Carlson | G01J 5/041 | 250/338.1 |
| 9,025,080 B2* | 5/2015 | Samuels | H04N 5/2254 | 348/207.99 |
| 9,432,561 B2* | 8/2016 | Samuels | G03B 17/568 | |
| 9,451,727 B2* | 9/2016 | Tolbert | H05K 1/0209 | |
| 9,674,412 B2* | 6/2017 | Bull | H04N 5/2253 | |
| 2010/0165132 A1* | 7/2010 | Tokiwa | G02B 27/646 | 348/208.11 |
| 2013/0093948 A1* | 4/2013 | Takeshita | H04N 5/2253 | 348/374 |
| 2013/0107111 A1* | 5/2013 | Campbell | H04N 5/2252 | 348/373 |
| 2013/0292477 A1* | 11/2013 | Hennick | G06K 7/10732 | 235/469 |
| 2014/0055671 A1* | 2/2014 | Kawamura | H04N 5/2252 | 348/374 |
| 2014/0104479 A1* | 4/2014 | Samuels | G03B 17/55 | 348/335 |
| 2014/0168507 A1* | 6/2014 | Renaud | H04N 5/2253 | 348/373 |
| 2014/0294375 A1* | 10/2014 | Shintani | G03B 17/14 | 396/529 |
| 2015/0049243 A1* | 2/2015 | Samuels | G03B 17/568 | 348/374 |
| 2015/0312457 A1* | 10/2015 | Kojima | G02B 23/2484 | 348/76 |
| 2016/0037031 A1* | 2/2016 | Bull | H04N 5/2253 | 348/374 |
| 2016/0174408 A1* | 6/2016 | Tolbert | H05K 1/0209 | 348/373 |
| 2017/0042058 A1* | 2/2017 | Pope | H05K 7/205 | |

* cited by examiner

METHOD AND SYSTEM FOR HEAT SINKING OF CAMERA MODULE

FIELD OF INVENTION

The present disclosure relates generally to camera for use in automotive applications including but not limited to rear-view cameras, and more particularly to methods and apparatus for heat sinking a camera module.

BACKGROUND

There has been a proliferation of the application camera technology in consumer devices such as cellular phones and computing devices. Automobiles manufacturers have also increasingly included cameras as a standard or optional feature for benefits including but not limited to enhancing vehicle safety, improving vehicle maneuverability, and providing convenience to the vehicle driver. Due to a rear-view camera's ability to prevent back over accidents and thereby reduce fatalities and serious injuries caused by those accidents, the National Highway Traffic Safety Administration (NHTSA) will require all new vehicles under 10,000 pounds to include rear visibility technology by May 2018. Accordingly, there is a need for cost effective designs for rear visibility technology in order to comply with NHTSA regulations.

Heat sinks are passive components used to transfer heat from one component to another. In electronic devices and electronic systems, heat sinks are used to dissipate heat into a surrounding medium. In devices that have multiple printed circuit boards (PCB), the design challenge is to bring the heat from each PCB out of the device. Because of the difficulty in fitting heat sinks or heat conductive material in a device due to numerous PCBs, perpendicular PCBs, or a lack of room, engineers often locate heat conductive pads outside of the electronic device in order to aid in heat transfer out of the device. Accordingly, there is a need for more efficient and effective methods and systems for heat sinking electronic devices such as cameras.

SUMMARY

A method and apparatus for heat sinking a camera module, which may be used in an automotive camera, which includes but is not limited to automotive rear-view cameras, is described herein. Heating conductors and heat conductive pads may be arranged in a parallel orientation within the housing of the camera module to dissipate heat produced by the printed circuit boards (PCBs) and other components within. The heat conducting pads may conduct heat away from the PCB or component being cooled and into the heat sink, which may be a heat conducting material including but not limited to aluminum, aluminum alloys, zinc, or copper. The heating pads may also fill the air gaps within the housing of the camera module.

In accordance with one embodiment, a heat conductor may be placed inside a camera module housing, wherein the heat conductor is placed in proximity to at least one printed circuit board (PCB) or component from a plurality of PCBs and components to be cooled. A first heat conductive pad may be placed in parallel along an upper side of the heat conductor. Finally a second heat conductive pad may be placed in parallel along an underside of the heat conductor. This parallel placement of heat conductive pads enables dissipation of heat produced by the plurality of PCBs and components to be cooled.

DETAILED DESCRIPTION OF THE PREFERRED EMBODIMENTS

Figure 1:
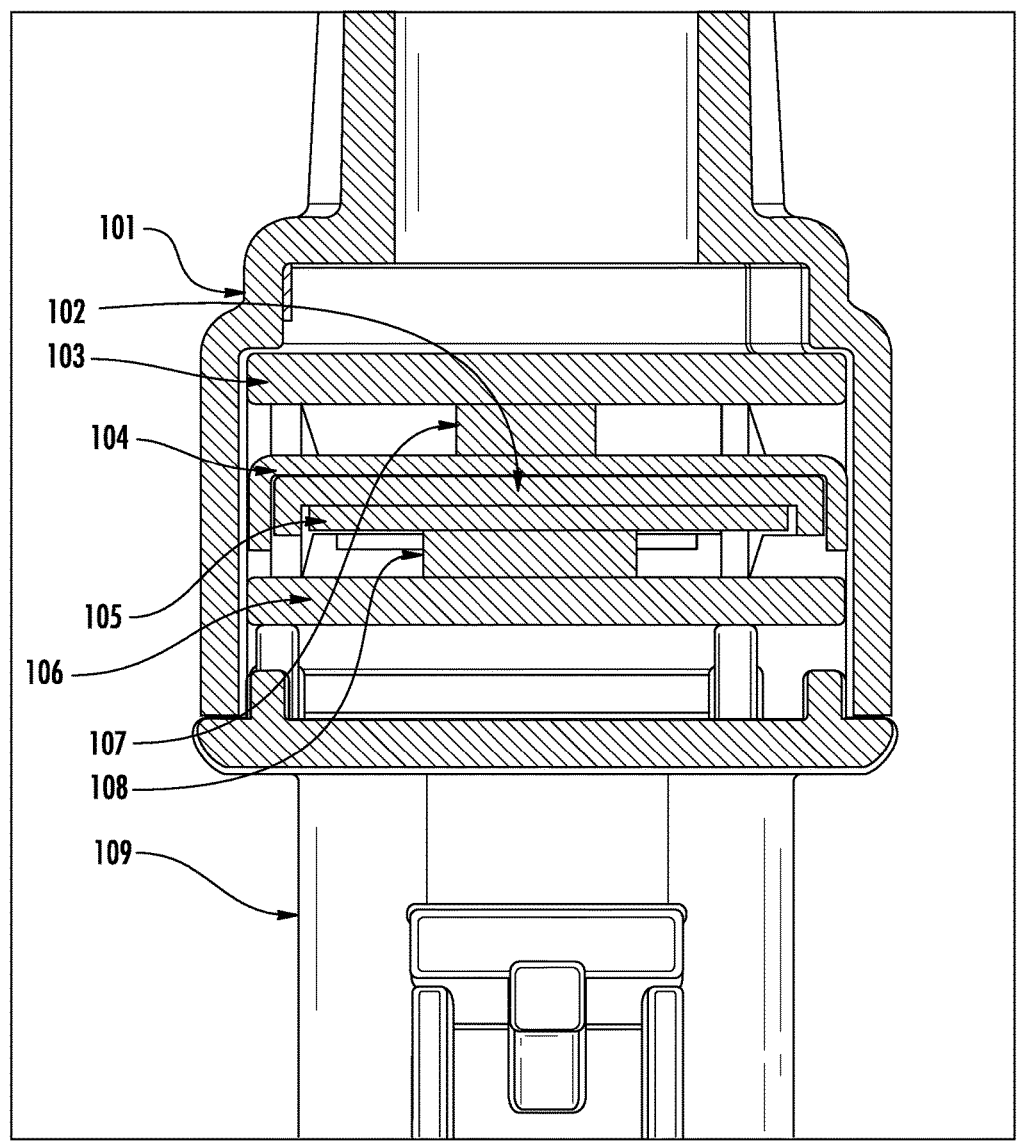
FIG. 1 is a diagram a camera module that includes a heat sink system in accordance with one embodiment.

Described herein are methods and apparatuses for heat sinking a camera module, which may be used in an automotive camera, which includes but is not limited to automotive rear-view cameras.

In the embodiments described herein, heating conductors and heat conductive pads are arranged in a parallel orientation within the housing of the camera module to dissipate heat produced by the printed circuit boards (PCBs) and other components within. The heat conducting pads may conduct heat away from the PCB or component being cooled and into the heat sink, which may be a heat conducting material including but not limited to aluminum, aluminum alloys, zinc, or copper. The heating pads may also fill the air gaps within the housing of the camera module.

It is to be understood that the figures and descriptions of embodiments for heat sinking a camera module have been simplified to illustrate elements that are relevant for a clear understanding, while eliminating, for the purpose of clarity, many other elements found in typical camera production processes. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein.

The non-limiting embodiments described herein are with respect to a system and method for heat sinking a camera module. Other electronic devices, modules and applications may also be used in view of these teachings without deviating from the spirit or scope as described herein. The systems and methods described herein may be modified for a variety of applications and uses while remaining within the spirit and scope of the claims. The embodiments and variations described herein, and/or shown in the drawings, are presented by way of example only and are not limiting as to the scope and spirit. The descriptions herein may be applicable to all embodiments of the sealed front half of a camera module although it may be described with respect to a particular embodiment.

FIG. 1 is a diagram of a camera module 100 that includes a heat sink system in accordance with one embodiment. The example camera module of FIG. 1 includes the camera module housing 101, a heat conductor 102, a first PCB 103, a first heat conductive pad 104, a second heat conductive pad 105, a second PCB 106, a first component 107, a second component 108, and an end cap 109. In this example, the heat conductor 102 may be used as a heat sink and may be made of a material including but not limited to aluminum, aluminum alloys, zinc, or copper. The heat conductive pads may be commercial off the shelf products.

As shown in the example of FIG. 1, the first heat conductive pad 104 and the second heat conductive pad 105 are placed within the camera module 100 between the first PCB 103 and the second PCB 106. The heat conductor 102 is placed between the first heat conductive pad 104 and the second heat conductive pad 105. Also as shown in this example, the first heat conductive pad 104 and the second heat conductive pad 105 are parallel to each other within the camera module housing 101. The first heat conductive pad 104 is folded over the edge of the heat conductor 102.

The first PCB 103, the second PCB 106, the first component 107, and the second component 108 in the camera module housing 101 generate heat due to their power consumption during operation. The first heat conductive pad 104 and the second heat conductive pad 105 may conduct heat away from the first PCB 103, the second PCB 106, the first component 107, or the second component 108 being cooled and into the heat conductor 102. The first heat conductive pad 104 and the second heat conductive pad 105 may also fill the air gaps within the camera module housing 101. The heat conductor then dissipates the heat into the camera module housing 101.

In another embodiment, the heat conductor may be of a length that allows it to nearly touch the surrounding camera module housing. In this embodiment, the heating conductive pads are not needed as the close proximity to the surrounding camera module housing allows the heat conductor to dissipate the heat directly into the surrounding camera module housing.

Figure 2:
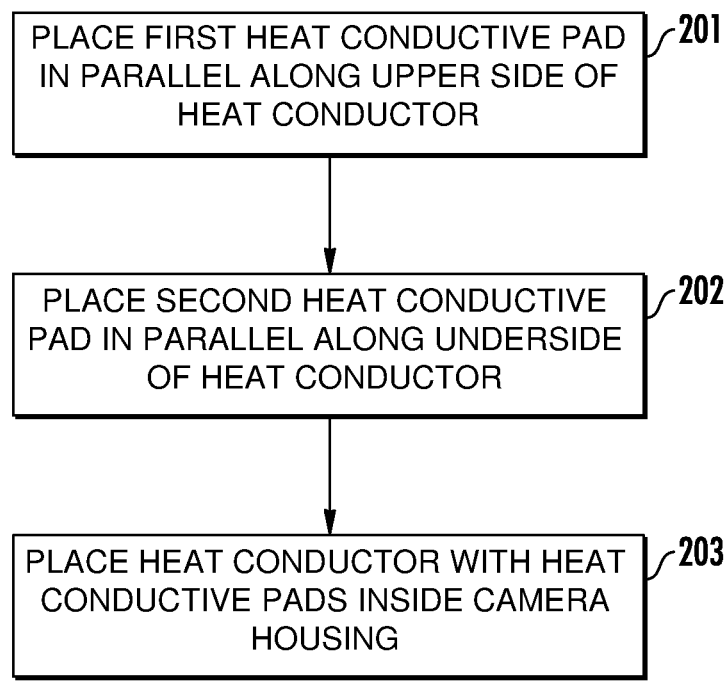
FIG. 2 is a flow diagram of a method for heat sinking a camera module.

FIG. 2 is a flow diagram of an example method 200 for heat sinking a camera module, in accordance with one embodiment, which may be used, for example, in an automotive camera. Referring to FIG. 2, at step 201, a first heat conductive pad is placed in parallel along the upper side of the heat conductor. At step 202, a second heat conductive pad is placed in parallel along the underside of the heat conductor. At step 203, a heat conductor with heat conductive pads is placed inside the camera module housing and in proximity to the PCBs and components to be cooled. By placing the heat conductive pads in a parallel orientation along the heat conductor within the housing of the camera module, the heat conductive pads and heat conductor are enabled to dissipate heat produced by the PCBs and other components within. The parallel heat conductive pads conduct heat away from the PCB or component being cooled and into the heat conductor. The heating pads may also fill the air gaps within the housing of the camera module.

As described herein, the methods described herein are not limited to any particular element(s) that perform(s) any particular function(s) and some steps of the methods presented need not necessarily occur in the order shown. For example, in some cases two or more method steps may occur in a different order or simultaneously. In addition, some steps of the described methods may be optional (even if not explicitly stated to be optional) and, therefore, may be omitted. These and other variations of the methods disclosed herein will be readily apparent, especially in view of the description of the systems described herein, and are considered to be within the full scope of the invention.

Although features and elements are described above in particular combinations, each feature or element can be used alone without the other features and elements or in various combinations with or without other features and elements.

What is claimed is:

1. A method for heat sinking a camera module, the method comprising:
    placing a first heat conductive pad in parallel along an upper side of a heat conductor and folding a portion of the first heat conductive pad over each edge of the upper side of the heat conductor;
    placing a second heat conductive pad that is planar and separate from the first heat conductive pad in parallel along an underside of the heat conductor and folding a portion of the heat conductor over each edge of the upper side of the second heat conductive pad to enable a dissipation of heat produced by a plurality of printed circuit boards (PCBs) and components to be cooled; and
    placing the heat conductor with the first and second heat conductive pads inside a camera module housing, wherein the heat conductor is placed in proximity to at least one PCB of the plurality of PCBs or component from the plurality of PCBs and components to be cooled;
    wherein the first heat conductive pad and the heat conductor are non-planar and the folded portion of the first heat conductive pad and the folded portion of the heat conductor extend past the second heat conductive pad.

2. The method of claim 1, wherein the camera module is associated with an automotive rear-view camera.

3. The method of claim 1, wherein the first heat conductive pad and second heat conductive pad fill air gaps within the camera module housing.

4. The method of claim 1, wherein the heat conductor is aluminum.

5. The method of claim 1, wherein the heat conductor is an aluminum alloy.

6. The method of claim 1, wherein the heat conductor is copper.

7. The method of claim 1, wherein the heat conductor is zinc.

8. A camera module, the camera module comprising:
    a first heat conductive pad placed in parallel along an upper side of a heat conductor, wherein a portion of the first heat conductive pad is folded over each edge of the upper side of the heat conductor;
    a second heat conductive pad that is planar and separate from the first heat conductive pad and placed in parallel along an underside of the heat conductor, wherein a portion of the heat conductor is folded over each edge of the upper side of the second heat conductive pad, to enable a dissipation of heat produced by a plurality of printed circuit boards (PCBs) and components to be cooled; and
    the heat conductor placed inside a camera module housing, wherein the heat conductor is placed in proximity to at least one PCB of the plurality of PCBs or component from the plurality of PCBs and components to be cooled;
    wherein the first heat conductive pad and the heat conductor are non-planar and the folded portion of the first heat conductive pad and the folded portion of the heat conductor extend past the second heat conductive pad.

9. The camera module of claim 8, wherein the camera module is associated with an automotive rear-view camera.

10. The camera module of claim 8, wherein the first heat conductive pad and second heat conductive pad fill air gaps within the camera module housing.

11. The camera module of claim 8, wherein the heat conductor is aluminum.

12. The camera module of claim 8, wherein the heat conductor is an aluminum alloy.

13. The camera module of claim 8, wherein the heat conductor is copper.

14. The camera module of claim 8, wherein the heat conductor is zinc.

* * * * *